United States Patent
Lee et al.

(10) Patent No.: US 9,923,453 B1
(45) Date of Patent: Mar. 20, 2018

(54) POWER MANAGEMENT DEVICE FOR ENERGY HARVESTING

(71) Applicant: Korea Advanced Institute of Science and Technology, Daejeon (KR)

(72) Inventors: Sang-Gug Lee, Daejeon (KR); Baek-Min Lim, Daejeon (KR); Jeong-Il Seo, Daejeon (KR); Young-Seok Noh, Daejeon (KR); Hyun-Mo Gu, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 15/603,815

(22) Filed: May 24, 2017

(30) Foreign Application Priority Data

Jan. 4, 2017 (KR) .................. 10-2017-0001471

(51) Int. Cl.
*H02M 3/158* (2006.01)
*H02M 1/36* (2007.01)
*H01L 35/02* (2006.01)

(52) U.S. Cl.
CPC .............. *H02M 1/36* (2013.01); *H01L 35/02* (2013.01); *H02M 3/158* (2013.01)

(58) Field of Classification Search
CPC ................... H02M 1/36; H02M 3/155–3/1588
See application file for complete search history.

(56) References Cited

U.S. PATENT DOCUMENTS

| 5,751,139 A | * | 5/1998 | Jordan | H02M 3/1588 323/222 |
| 6,037,754 A | * | 3/2000 | Harper | H02M 3/156 323/222 |
| 8,432,140 B1 | * | 4/2013 | Deutscher | H02M 3/158 323/222 |

(Continued)

FOREIGN PATENT DOCUMENTS

| CN | 105991029 A | 10/2016 |
| KR | 20130108818 A | 10/2013 |

OTHER PUBLICATIONS

Korean Office Action (with English machine translation) dated Aug. 21, 2017; for Korean Pat. App. No. 10-2017-0001471; 8 pages.

*Primary Examiner* — Yusef Ahmed
(74) *Attorney, Agent, or Firm* — Daly, Crowley, Mofford & Durkee, LLP

(57) ABSTRACT

A power management device according to example embodiments includes a self-startup circuit including an oscillator and a voltage multiplier to generate a start-up voltage in a first start-up period based on an input voltage, a boost converter to alternately charge the start-up voltage and an output voltage within a start-up voltage range during a second start-up period and to charge only the output voltage during an operation period, a controller to control the self-startup circuit and the boost converter based on a magnitude of the start-up voltage, a voltage charger including a start-up voltage capacitor and an output voltage capacitor, and a shared inductor connected between the input node and a common input node. The shared inductor oper- (Continued)

ates as a part of the oscillator during the first start-up period and a part of the boost converter during the second start-up and operation periods.

10 Claims, 5 Drawing Sheets

(56) References Cited

U.S. PATENT DOCUMENTS

| | | | | |
|---|---|---|---|---|
| 2003/0090245 A1* | 5/2003 | Shenai | G06F 1/3203 | 323/259 |
| 2005/0110469 A1* | 5/2005 | Inaba | H02M 3/156 | 323/222 |
| 2005/0194951 A1* | 9/2005 | Mehas | H02M 1/36 | 323/282 |
| 2006/0152200 A1* | 7/2006 | Kanai | H02J 7/35 | 323/222 |
| 2007/0075687 A1* | 4/2007 | Ishii | H02M 3/1582 | 323/225 |
| 2007/0132435 A1* | 6/2007 | Hasegawa | H02M 1/36 | 323/222 |
| 2007/0210774 A1* | 9/2007 | Kimura | H02M 1/36 | 323/282 |
| 2008/0067985 A1* | 3/2008 | Chang | H02M 1/36 | 323/222 |
| 2008/0074158 A1* | 3/2008 | Ryu | H02M 1/36 | 327/143 |
| 2008/0224673 A1* | 9/2008 | Chien | H02M 1/36 | 323/271 |
| 2009/0001946 A1* | 1/2009 | Mehas | H02M 1/36 | 323/266 |
| 2010/0045251 A1* | 2/2010 | Murota | H02M 3/158 | 323/282 |
| 2011/0221513 A1* | 9/2011 | Fujisawa | G11C 5/145 | 327/536 |
| 2012/0181942 A1* | 7/2012 | Redjebian | H05B 41/28 | 315/210 |
| 2013/0002224 A1* | 1/2013 | Lin | H02M 1/36 | 323/285 |
| 2014/0266135 A1* | 9/2014 | Zhak | H02M 1/36 | 323/311 |
| 2015/0061738 A1* | 3/2015 | Kwon, II | H02M 3/073 | 327/157 |
| 2016/0344280 A1* | 11/2016 | Al-Shyoukh | H02M 1/36 | |
| 2017/0070138 A1* | 3/2017 | Ogawa | H02M 3/07 | |

\* cited by examiner

POWER MANAGEMENT DEVICE FOR ENERGY HARVESTING

CROSS REFERENCE TO RELATED APPLICATION

This application claims priority to and the benefit of Korean Patent Application No. 10-2017-0001471, filed on Jan. 4, 2017 in the Korean Intellectual Property Office (KIPO), the disclosure of which is hereby incorporated by reference herein in its entirety.

BACKGROUND

1. Field

Example embodiments of the inventive concept relate to an energy harvesting system. More particularly, example embodiments of the inventive concept relate to power management device in the energy harvesting system.

2. Discussion of Related Art

Energy harvesting refers to a technology that collects the energy from natural energy sources and turns it into electrical energy. For example, solar power generation is a typical energy harvesting technology. Thermoelectric energy harvesting produces electrical energy using the thermoelectric effect, in which a temperature difference of an object is converted to a potential difference or a potential difference is converted to a temperature difference. A typical application area is the healthcare field, and it is possible to operate various body sensors and communication equipments attached to a body by using an energy generated through the temperature difference between a body temperature and an air temperature. An element that generates electric energy using the thermoelectric effect is called a thermoelectric element (or thermoelectric device). Thermoelectric energy harvesting technique must be capable of harvesting electrical energy with a sufficiently high potential (e.g., above about 1 V) even when the temperature difference of the thermoelectric element is small (e.g., $\Delta T<10°$ C.). Since an output voltage of the thermoelectric element can not exceed 100 mV at a small temperature difference, a power management integrated circuit (PMIC) capable of starting up only with a low output voltage of the thermoelectric element is required.

The thermoelectric element used in the thermoelectric energy harvesting system has a very low output voltage as well as a low output power (e.g., less than 1 mW). Therefore, in order to drive a healthcare apparatus or the like using energy harvested from the thermoelectric element, the efficiency of the power management device between the thermoelectric element and the healthcare apparatus should be high.

FIG. 1 is a block diagram illustrating an example of a thermoelectric energy harvesting system in the prior art.

Referring to FIG. 1, the thermoelectric energy harvesting system 1 in the prior art may include an energy harvester 10, a power management device 20, and at least one healthcare device 30.

The power management device 20 in the thermoelectric energy harvesting system 1 includes a startup circuit 22 for starting up the power management device 20 from a low input voltage VIN and a boost converter 24 for providing a high power output voltage VOUT converted from the input voltage VIN to a load (e.g., the healthcare device 30). The startup circuit 22 starts generating a driving voltage VDD that can drive the boost converter 24 when the input voltage VIN exceeds a predetermined self-startup voltage. The boost converter 24 is driven by a power generated from the startup circuit 22 and boosts the input voltage VIN to the output voltage VOUT greater than the input voltage VIN. As described above, since the input voltage VIN has a very low voltage level, it requires a low self-startup voltage that can start up at the low input voltage VIN and requires the boost converter 24 having a high efficiency even at the low input voltage VIN to supply sufficient power to the load. That is, the thermoelectric energy harvesting system 1 requires a power management device using the self-startup voltage and having higher output efficiency, while being manufactured from a combination of startup circuit 22 and boost converter 24 at a lower bill of material (BOM).

SUMMARY

Example embodiments provide a power management device including a simple Colpitts oscillator, a boost converter, and a shared inductor commonly used for the Colpitts oscillator and the boost converter.

According to example embodiments, a power management device may comprise a self-startup circuit including an oscillator and a voltage multiplier to generate a start-up voltage for starting up the power management device in a first start-up period based on an input voltage applied from a thermoelectric element to an input node, a boost converter to alternately charge the start-up voltage and an output voltage within a predetermined start-up voltage range during a second start-up period following the first start-up period and to charge only the output voltage during an operation period following the second start-up period, the output voltage being applied to a load, a controller to be started up by the start-up voltage, and to control the self-startup circuit and the boost converter based on a magnitude of the start-up voltage, a voltage charger including a start-up voltage capacitor to store the start-up voltage and an output voltage capacitor to store the output voltage, and a shared inductor connected between the input node and a common input node of the oscillator and the boost converter, the shared inductor to operate as a part of the oscillator during the first start-up period and operate as a part of the boost converter during the second start-up period and the operation period.

In example embodiments, the oscillator and the shared inductor may operate together as a Colpitts oscillator.

In example embodiments, the oscillator may comprise first and second oscillation capacitors connected in series between the common input node and a ground, a native transistor including a drain electrode connected to the input node, a source electrode connected a first node between the first oscillation capacitor and the second oscillation capacitor, and a gate electrode receiving a control voltage from the controller, and a control capacitor connected between the gate electrode and the common input node.

In example embodiments, the controller may deactivate the self-startup circuit and activate the boost converter to start the second start-up period when the start-up voltage is greater than a predetermined reference voltage.

In example embodiments, the controller may output the control voltage at 0V in the second period.

In example embodiments, the boost converter may charge the start-up voltage to the start-up capacitor until the start-up voltage reaches an upper boundary value of the start-up voltage range from a lower boundary value of the start-up voltage range in the second start-up period.

In example embodiments, the boost converter may charge the output voltage to the output voltage capacitor until the start-up voltage reaches the lower boundary value of the start-up voltage from the upper boundary value of the start-up voltage range.

In example embodiments, the voltage multiplier includes a plurality of voltage doubler stages. Each of the voltage doubler stages may comprise a first transistor having a diode connected structure in which a drain electrode and a gate electrode are connected to the input node, a second transistor having the diode connected structure connected in series to the first transistor to output the start-up voltage, a first voltage doubler capacitor connected between a source electrode of the first transistor and the common input node, and a second voltage double capacitor connected between a source electrode of the second transistor and a ground.

In example embodiments, the controller may activate the operation period when the output voltage and the start-up voltage become substantially the same in the second start-up period.

In example embodiments, the voltage charger may further comprise a switch to electrically connect one end of the start-up voltage capacitor and one end of the output voltage capacitor. The controller may turn on the switch in the operation period.

In example embodiments, the controller may output the control voltage as a negative voltage in the operation period.

Therefore, the power management device according to example embodiments may include the shared inductor commonly used in the oscillator and the boost converter in the start-up period and the operation period so that the configurations of the self-startup circuit and the boost converter may be simplified and the manufacturing cost and BOM may be reduced. Also, the self-startup circuit for self starting up may amplify the input voltage to the start-up voltage to start up the controller and other components, so that the output efficiency of the power management device may be greatly improved.

BRIEF DESCRIPTION OF THE DRAWINGS

Example embodiments can be understood in more detail from the following description taken in conjunction with the accompanying drawings, in which.

DETAILED DESCRIPTION OF EMBODIMENTS

Figure 1:
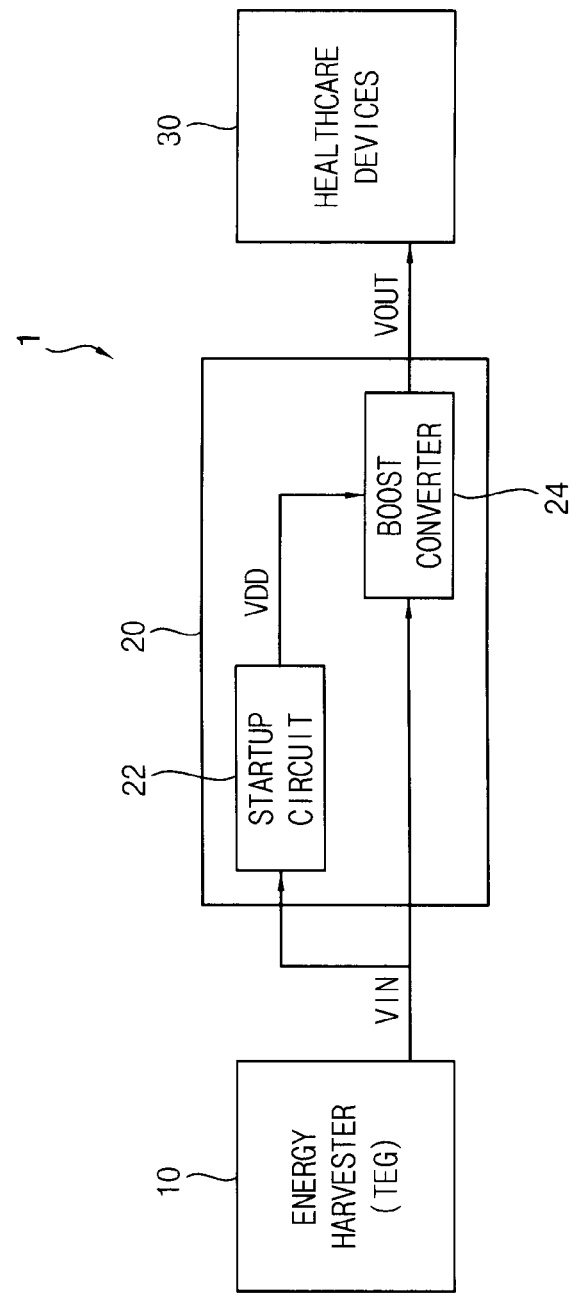
FIG. 1 is a block diagram illustrating an example of a thermoelectric energy harvesting system in the prior art.

It will be understood that, although the terms first, second, third etc. may be used herein to describe various elements, components, and/or sections, these elements, components, and/or sections should not be limited by these terms. These terms are only used to distinguish one element, component, or section from another element, component, or section. Thus, a first element, component, or section discussed below could be termed a second element, component, or section without departing from the teachings of example embodiments.

It will be understood that when an element or layer is referred to as being "connected to" or "coupled to" another element, it can be directly on, connected or coupled to the other element or intervening elements or layers may be present. In contrast, when an element is referred to as being "directly on," "directly connected to" or "directly coupled to" another element, there are no intervening elements present. Like or similar reference numerals refer to like or similar elements throughout. As used herein, the term "and/or" includes any and all combinations of one or more of the associated listed items.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises", "includes", "including", and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments will be described more fully hereinafter with reference to the accompanying drawings, in which various embodiments are shown.

Figure 2:
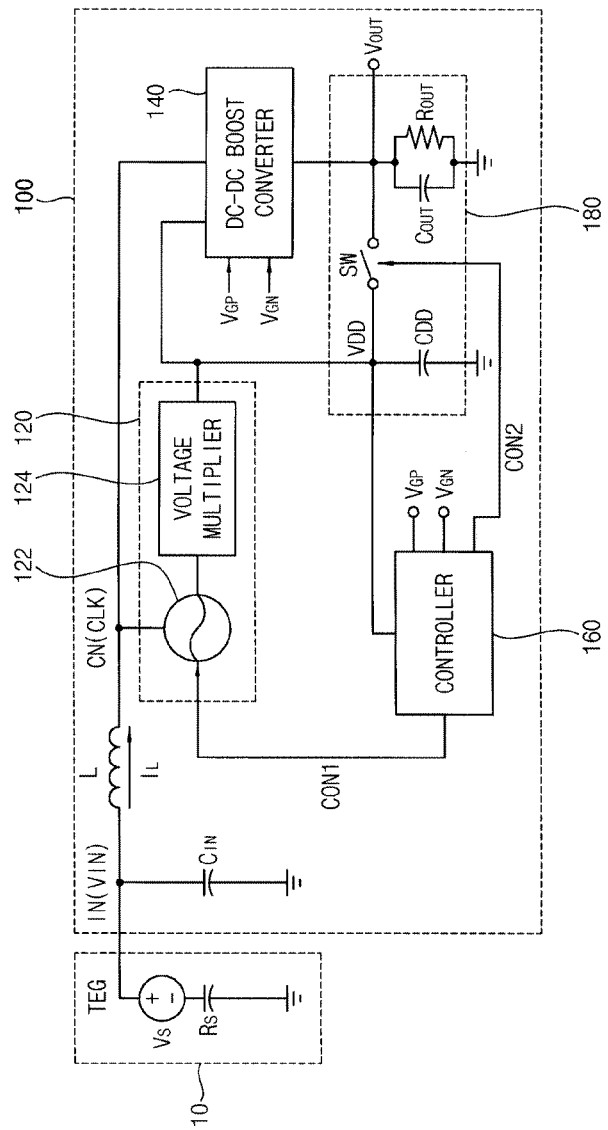
FIG. 2 is a block diagram of a power management device according to example embodiments.
Figure 3:
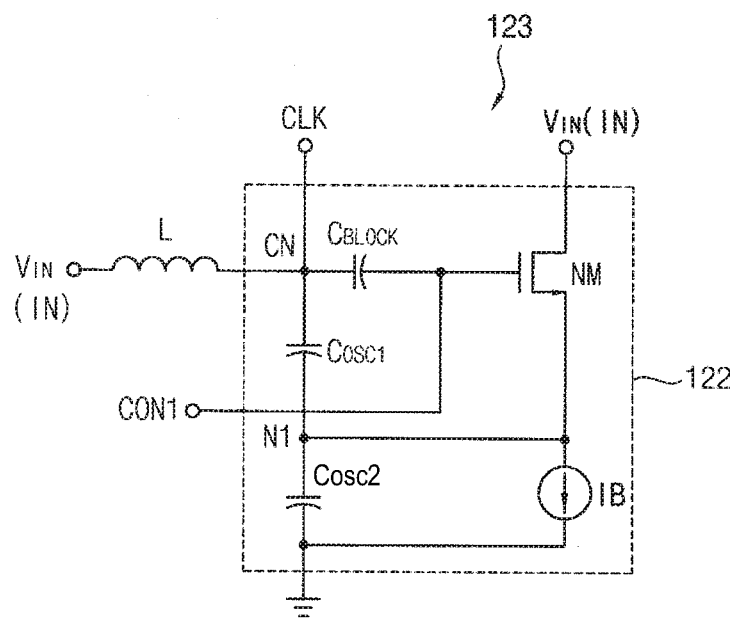
FIG. 3 illustrates an example of an oscillator in a self-startup circuit of the power management device of FIG. 2.
Figure 4:
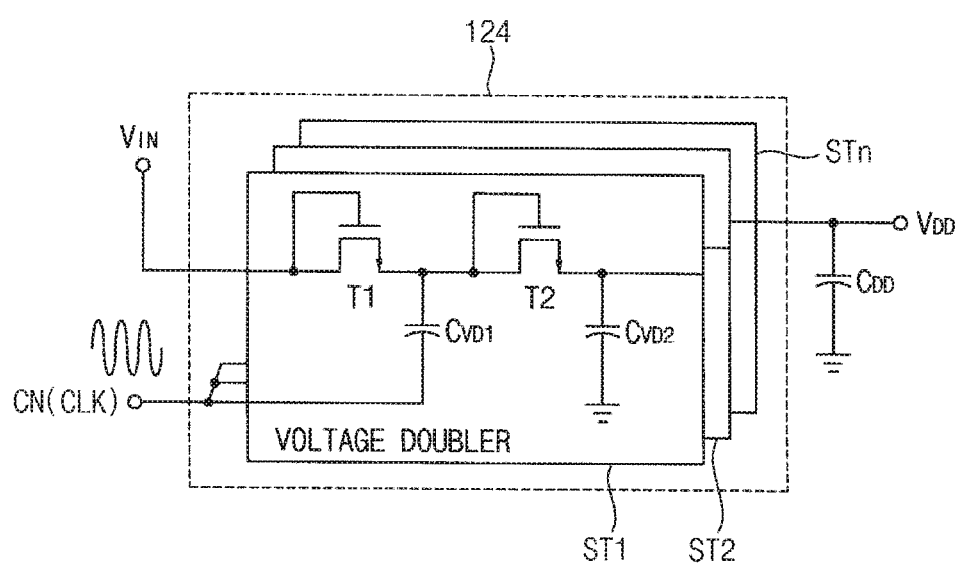
FIG. 4 is a diagram illustrating an example of a voltage multiplier in a self-startup circuit of the power management device of FIG. 2.
Figure 5:
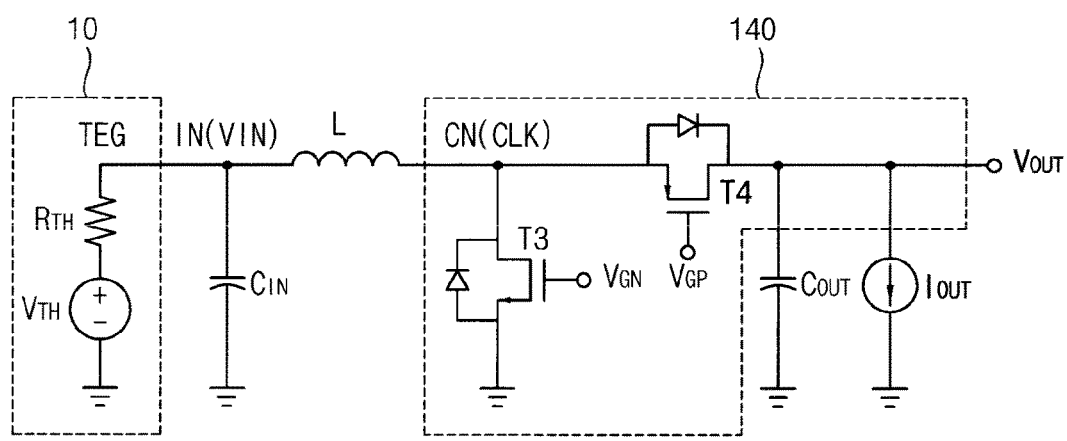
FIG. 5 is a circuit diagram illustrating an example of a boost converter included in the power management device of FIG. 2.
Figure 6:
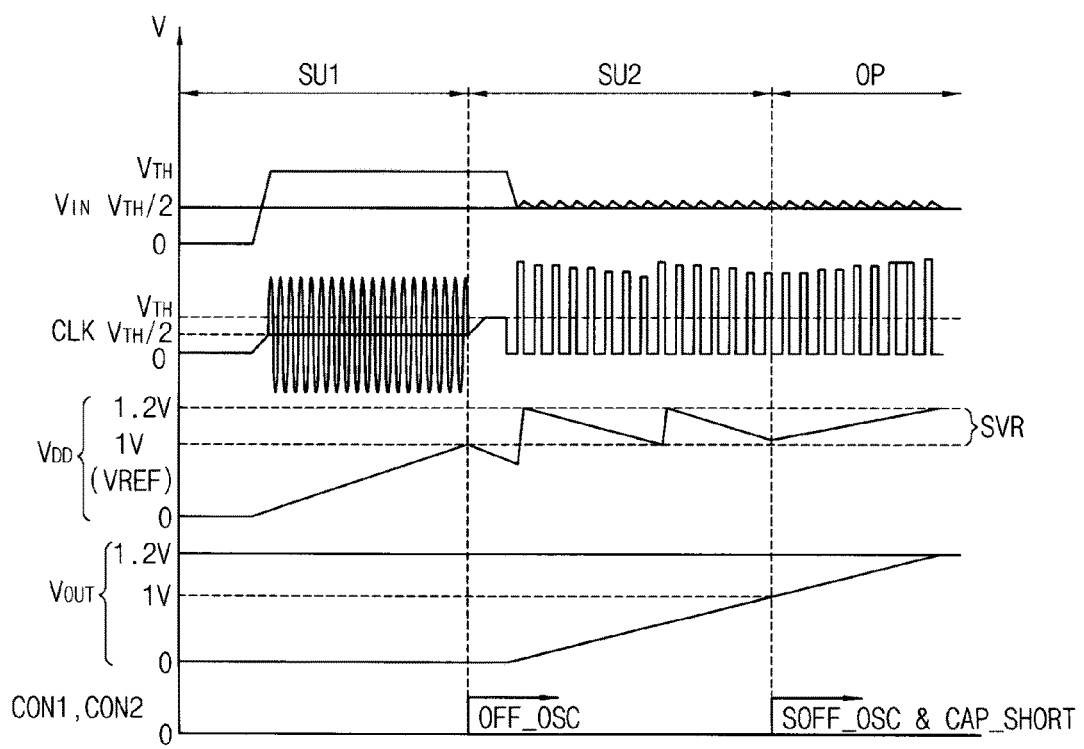
FIG. 6 is a timing diagram illustrating an example of an operation of the power management device of FIG. 2.

FIG. 2 is a block diagram of a power management device according to example embodiments. FIG. 3 illustrates an example of an oscillator in a self-startup circuit of the power management device of FIG. 2. FIG. 4 is a diagram illustrating an example of a voltage multiplier in a self-startup circuit of the power management device of FIG. 2. FIG. 5 is a circuit diagram illustrating an example of a boost converter included in the power management device of FIG. 2. FIG. 6 is a timing diagram illustrating an example of an operation of the power management device of FIG. 2.

Referring to FIGS. 2 to 6, the power management device 100 may include a self-startup circuit 120, a boost converter 140, a controller 160, a voltage charger 180, and a shared inductor L.

The self-startup circuit 120 may include an oscillator 122 and a voltage multiplier 124 to generate a start-up voltage VDD for starting up the power management device 100 in a first start-up period SU1 based on an input voltage VIN applied from an external thermoelectric element 10 (e.g., an energy harvester) to an input node IN.

The input voltage VIN is applied to an external capacitor CIN when a temperature difference occurs in the thermoelectric element 10. The first start-up period SU1 may be a period in which a very low input voltage VIN generated by the thermoelectric element 10 is amplified to the start-up voltage VDD by the self-startup circuit 120. In some embodiments, only the self-startup circuit 120 of the power management device 100 may operate during the first start-up period SU1.

The oscillator 122 and the shared inductor L may form a Colpitts oscillator 123. The Colpitts oscillator 123 may start a oscillating operation when the input voltage VIN exceeds (or is greater than) a threshold voltage of a native transistor NM included in the oscillator 122. Since the threshold voltage of the native transistor NM may be nearly zero, the self-startup circuit 120 may be started up even at the input voltage VIN having a very low voltage level.

The voltage multiplier 124 may operate by a clock signal CLK which is an output of the oscillator 122 and generate the start-up voltage VDD based on the clock signal CLK. The voltage multiplier 124 may amplify the input voltage VN to the start-up voltage VDD. The start-up voltage VDD may start up the controller 160 to control other components.

The oscillator 122 may generate the clock signal CLK by applying a capacitive positive feedback to the native transistor NM. As illustrated in FIG. 3, in some embodiments, the oscillator 122 may include first and second oscillation capacitors COSC1 and COSC2, the native transistor NM, a control capacitor CBLOCK, and a bias circuit IB. The first and second oscillation capacitors COSC1 and COSC2 may be connected in series between a common input node CN and a ground. The native transistor NM may include a drain electrode connected to an input node IN, a source electrode connected a first node N1 between the first oscillation capacitor COSC1 and the second oscillation capacitor COSC2, and a gate electrode receiving a first control voltage CON1 from the controller 160. The control capacitor CBLOCK may be connected between the gate electrode of the native transistor NM and the ground. The bias circuit IB may be connected between the first node N1 and the ground. The oscillator 122 and the shared inductor L may operate together as the Colpitts oscillator 123.

The oscillator 122 may form a positive feedback path leading to the gate electrode-source electrode-gate electrode of the native transistor NM using the first and second oscillation capacitors COSC1 and COSC2, and receive the input voltage VIN from the shared inductor L between the drain electrode and the gate electrode. Thus, an oscillation signal by the positive feedback, i.e., the clock signal CLK may be generated.

The control capacitor CBLOCK may determine whether or not the oscillator 122 is activated together with a control signal CON1 (e.g., the first control voltage CON1).

In some embodiments, the first control voltage CON1 of 0V may be applied to the gate electrode of the native transistor NM when the start-up voltage VDD exceeds a predetermined reference voltage VREF (e.g., set to 1V in FIG. 6). That is, when the start-up voltage VDD is gradually raised (or amplified) by the operation of the self-startup circuit 120 and the start-up voltage VDD exceeds the reference voltage VREF in the first start-up period SU1, the operation of the self-startup circuit 120 may be stopped (or deactivated) by the first control voltage to terminate the first start-up period SU1 and start a second start-up period SU2.

In some embodiments, the first control voltage CON1 having a negative voltage may be applied to the gate electrode of the native transistor NM when an output voltage VOUT of the power management device 100 is greater than the start-up voltage VDD (e.g., the second start-up period SU2 is terminated and an operation period OP is started, self-charge is terminated). Thus, the oscillator 122 may be completely turned off during the operation period OP, and current consumption and power loss inside the power management device 100 in the operation period OP can be minimized.

The bias circuit IB may provide a bias to the native transistor NM. Although the bias circuit IB is shown as a constant current source in FIG. 3, this is an example, and the bias circuit IB may be implemented in various known ways.

As illustrated in FIG. 4, the voltage multiplier 124 may include a plurality of voltage doubler stages ST1 to STn. In some embodiments, each of the voltage doubler stages ST1 to STn may include a first transistor T1 having a diode connected structure in which a drain electrode and a gate electrode are connected to the input node IN, a second transistor T2 having the diode connected structure connected in series to the first transistor T1 to output the start-up voltage VDD, a first voltage doubler capacitor CVD1 connected between a source electrode of the first transistor T1 and the common input node CN, and a second voltage double capacitor CVD2 connected between a source electrode of the second transistor T2 and the ground. That is, each of the voltage doubler stages ST1 to STn may be composed of two transistors and two capacitors.

In some embodiments, the first and second transistors T1 and T2 may be native transistors.

Each of the voltage doubler stages ST1 to STn may amplify the input voltage VIN to the start-up voltage VDD on the same principle as a general Dickson charge pump. Since one end of the second voltage doubler capacitor CVD2 is connected to the ground, the voltage gain of each stage, but there is an advantage that the voltage gain is obtained only by the same phase clock signal (i.e., the one clock signal CLK).

As illustrated in FIG. 6, the self-startup circuit 120 may operate based on a fine input voltage VIN in the first start-up period SU1 to generate the clock signal CLK and the start-up voltage VDD may be generated and raised (increased). In some embodiments, the first control voltage CON1 may have a voltage level for activating the self-startup circuit 120.

The boost converter 140 may alternately charge the start-up voltage VDD and the output voltage VOUT within a predetermined start-up voltage range SVR during the second start-up period SU2 following the first start-up period SU1 and charge only the output voltage VOUT during the operation period OP following the second start-up period SU2. The output voltage VOUT may be applied to a load. The load may be external devices such as healthcare devices or the like.

The second start-up period SU2 may be a period during which the self-startup circuit 120 is deactivated and the boost converter 140 alternately charges the start-up voltage VDD and the output voltage VOUT.

The boost converter 140 may form a boost convert circuit with the shared inductor L. In some embodiments, the boost converter 140 may include an N-channel metal oxide semiconductor (NMOS) transistor T3 and a P-channel metal oxide semiconductor (PMOS) transistor T4. Control signals VGN and VGP having the same phase may be respectively applied from the controller 160 to the NMOS transistor T3 and the PMOS transistor T4. A current having a constant slope (e.g., VIN/L) may be stored in the shared inductor L when the control signals VGN and VGP are on-state. When the control signals VGN and VGP are in an off-state, the energy stored in the shared inductor L may be output through the PMOS transistor T4 and a charge may be transferred to a capacitor COUT (e.g., an output voltage capacitor) such that the output voltage VOUT may rise. A magnitude of the output voltage VOUT may be adjusted by on-off duty control of the control signals VGN and VGP. Accordingly, the shared inductor L may operate as a part of the boost converter 140 during the second start-up period SU2 and the operation period OP.

However, this is an example, and the configuration of the boost converter 140 is not limited thereto. For example, the PMOS transistor T4 may be replaced by a diode.

The boost converter 140 may control the output or charging of the start-up voltage VDD and the output voltage VOUT based on the magnitudes of the start-up voltage VDD and the output voltage VOUT. The start-up voltage VDD output from the boost converter 140 may be stored in the start-up voltage capacitor CDD included in the voltage charger 180, and the output voltage VOUT output from the boost converter 140 may be stored in the output voltage capacitor COUT included in the voltage charger 180.

In some embodiments, the boost converter 140 may alternately charge the start-up voltage VDD and the output voltage VOUT based on a single input multiple output (SIMO) operation. Thus, the start-up voltage VDD may be controlled to fall within the start-up voltage range SVR during the second start-up period SU2 and the stable output voltage VOUT may be obtained.

In some embodiments, as illustrated in FIG. 6, the boost converter 140 may charge the start-up voltage VDD to the start-up voltage capacitor CDD until the start-up voltage VDD reaches an upper boundary value (represented as 1.2V in FIG. 6) of the start-up voltage range SVR. That is, the boost converter 140 may perform a self-charging until the start-up voltage VDD reaches the upper boundary value of the start-up voltage range SVR. The boost converter 140 may stop the charging of the start-up voltage VDD and charge the output voltage VOUT for providing the load when the start-up voltage VDD reaches the upper boundary value. In some embodiments, the boost converter 140 may charge the output voltage VOUT to the output voltage capacitor COUT until the start-up voltage VDD reaches a lower boundary value (represented as 1V in FIG. 6) of the start-up voltage range SVR from the upper boundary value.

Accordingly, in the second start-up period SU2, the start-up voltage VDD and the output voltage VOUT may be alternately charged and the start-up voltage VDD does not deviate the start-up voltage range SVR. Thus, the output voltage may be stably increased.

The comparison between the start-up voltage VDD and the start-up voltage range SVR and the output control of the boost converter 140 may be controlled by the controller 160.

The controller 160 may be started up by the start-up voltage VDD and control the self-startup circuit 120 and the boost converter 140 based on the magnitude of the start-up voltage VDD. The controller 160 may control the operations of the first start-up period SU1, the second start-up period SU2, and the operation period OP.

The voltage charger 180 may include the start-up voltage capacitor CDD to store the start-up voltage VDD and the output voltage capacitor COUT to store the output voltage VOUT.

As described above, in some embodiments, the controller 160 may deactivate the self-startup circuit 120 and activate the boost converter 140 to start the second start-up period SU2 when the start-up voltage VDD is greater than (exceeds) the reference voltage VREF. For example, the controller 140 may output the first control voltage CON1 at about 0V in the second start-up period SU2 so that the self-startup circuit 120 may be deactivated (i.e., represented as OFF_OSC in FIG. 6).

In some embodiments, the controller 160 may terminate the second start-up period SU2 and activate the operation period OP when the output voltage VOUT and the start-up voltage VDD become substantially the same in the second start-up period SU2. The operation period OP may be a period in which the boost converter 140 charges only the output voltage VOUT.

As illustrated in FIG. 2, in some embodiments, the voltage charger 180 may further include a switch SW to electrically connect one end of the start-up voltage capacitor CDD and one end of the output voltage capacitor COUT. The controller 160 may further output a second control signal CON2 to control the switch SW and turn on the switch in the operation period OP. Thus, the one end of the start-up voltage capacitor CDD and the one end of the output voltage capacitor COUT may be shorted (i.e., represented as CAP_SHORT in FIG. 6) in the operation period OP and the SIMO operation may be terminated. Thus, the output voltage VOUT and the start-up voltage VDD may be shared so that the boost converter 140 may charge only the output voltage capacitor COUT. That is, in the operation period OP, only the load charge for supplying the voltage to the load may be performed.

In some embodiments, the controller 160 may output the first control voltage CON1 as a negative voltage in the operation period OP to completely turn off the oscillator 122 and the self-startup circuit 120 (represented as SOPP_OSC). Therefore, the current consumption and power loss inside the power management device 100 in the operation period OP may be minimized.

In other words, as illustrated in FIG. 6, in the first start-up period SU1, the self-startup circuit 120 may start up by the input voltage VIN and generate the start-up voltage VDD by amplifying the input voltage VIN. When the start-up voltage VDD exceeds the reference voltage VREF, the self-startup circuit 120 may be deactivated (OFF_OSC) so that the first start-up period SU1 may be ended and the second start-up period SU2 may be started. The boost converter 140 may alternately perform the self-charging (i.e. charging the start-up voltage capacitor CDD) and the load charging (i.e., charging the output voltage capacitor COUT) based on the SIMO operation during the second start-up period SU2. Here, the charge amount of the start-up voltage VDD may be regulated within the start-up voltage range SVR and the output voltage VOUT may be continuously rise to the start-up voltage level.

When the output voltage VOUT becomes substantially equal to the start-up voltage VDD, the second start-up period SU2 and the SIMO operation may be ended and the operation period OP may be started. The output voltage VOUT and the start-up voltage may be shared so that the boost converter 140 may charge only the output voltage capacitor COUT in the operation period OP.

As described above, the power management device 100 may include the shared inductor L commonly used in the oscillator 122 and the boost converter 140 in the start-up period and the operation period so that the configurations of the self-startup circuit 120 and the boost converter 140 may be simplified and the manufacturing cost and BOM may be reduced. Also, the self-startup circuit 120 for self starting up may amplify the input voltage VIN to the start-up voltage VDD to start up the controller 160 and other components, so that the output efficiency of the power management device 100 may be greatly improved.

The present embodiments may be applied to any energy harvesting system and various power management devices used therein.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. A power management device, comprising:
   a self-startup circuit including an oscillator and a voltage multiplier to generate a start-up voltage for starting up the power management device in a first start-up period based on an input voltage applied from a thermoelectric element to an input node;
   a boost converter for performing boost converting to alternately charge the start-up voltage and an output voltage within a predetermined start-up voltage range during a second start-up period following the first start-up period and to charge only the output voltage during an operation period following the second start-up period, the output voltage being applied to a load;
   a controller to be started up by the start-up voltage, and to control the self-startup circuit and the boost converter based on a magnitude of the start-up voltage;
   a voltage charger including a start-up voltage capacitor to store the start-up voltage and an output voltage capacitor to store the output voltage; and
   a shared inductor connected between the input node and a common input node of the oscillator and the boost converter, the shared inductor to operate as a part of the oscillator during the first start-up period and operate as a part of the boost converter during the second start-up period and the operation period.

2. The device of claim 1, wherein the oscillator and the shared inductor operate together as a Colpitts oscillator.

3. The device of claim 2, wherein the oscillator comprises:
   first and second oscillation capacitors connected in series between the common input node and a ground;
   a native transistor including a drain electrode connected to the input node, a source electrode connected a first node between the first oscillation capacitor and the second oscillation capacitor, and a gate electrode receiving a control voltage from the controller; and
   a control capacitor connected between the gate electrode and the common input node.

4. The device of claim 3, wherein the controller deactivates the self-startup circuit and activates the boost converter to start the second start-up period when the start-up voltage is greater than a predetermined reference voltage.

5. The device of claim 4, wherein the controller outputs the control voltage at 0V in the second start-up period.

6. The device of claim 2, wherein the boost converter charges the start-up voltage to the start-up voltage capacitor until the start-up voltage reaches an upper boundary value of the predetermined start-up voltage range from a lower boundary value of the start-up voltage range in the second start-up period, and
   wherein the boost converter charges the output voltage to the output voltage capacitor until the start-up voltage reaches the lower boundary value of the start-up voltage from the upper boundary value of the start-up voltage range.

7. The device of claim 1, wherein the voltage multiplier includes a plurality of voltage doubler stages, and
   wherein each of the voltage doubler stages comprises:
   a first transistor having a diode connected structure in which a drain electrode and a gate electrode are connected to the input node;
   a second transistor having the diode connected structure connected in series to the first transistor to output the start-up voltage;
   a first voltage doubler capacitor connected between a source electrode of the first transistor and the common input node; and
   a second voltage double capacitor connected between a source electrode of the second transistor and a ground.

8. The device of claim 1, wherein the controller activates the operation period when the output voltage and the start-up voltage become substantially the same in the second start-up period.

9. The device of claim 8, wherein the voltage charger further includes:
   a switch to electrically connect one end of the start-up voltage capacitor and one end of the output voltage capacitor, and
   wherein the controller turns on the switch in the operation period.

10. The device of claim 9, wherein the controller outputs a control voltage as a negative voltage in the operation period.

* * * * *